(12) United States Patent
Kim

(10) Patent No.: US 10,841,708 B2
(45) Date of Patent: Nov. 17, 2020

(54) VEHICLE SPEAKER AND METHOD OF CONTROLLING THE SAME

(71) Applicants: Hyundai Motor Company, Seoul (KR); Kia Motors Corporation, Seoul (KR)

(72) Inventor: Youngbeom Kim, Bucheon-si (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 0 days.

(21) Appl. No.: 16/548,249

(22) Filed: Aug. 22, 2019

(65) Prior Publication Data

US 2020/0196063 A1 Jun. 18, 2020

(30) Foreign Application Priority Data

Dec. 12, 2018 (KR) .................. 10-2018-0160322

(51) Int. Cl.
| | |
|---|---|
| H04R 9/06 | (2006.01) |
| H04R 29/00 | (2006.01) |
| H04R 3/00 | (2006.01) |
| H02M 3/156 | (2006.01) |
| G01R 27/26 | (2006.01) |
| G10L 15/22 | (2006.01) |
| G01R 21/06 | (2006.01) |

(52) U.S. Cl.
CPC ............. H04R 9/06 (2013.01); G01R 21/06 (2013.01); G01R 27/2611 (2013.01); G10L 15/22 (2013.01); H02M 3/156 (2013.01); H04R 3/007 (2013.01); H04R 29/003 (2013.01); H04R 2430/01 (2013.01)

(58) Field of Classification Search
CPC ...... H04R 3/007; H04R 29/00; H04R 29/001; H04R 29/003
See application file for complete search history.

(56) References Cited

U.S. PATENT DOCUMENTS

| | | | |
|---|---|---|---|
| 2017/0105068 A1* | 4/2017 | Lesso | H04R 29/003 |
| 2017/0180897 A1* | 6/2017 | Perianu | H04R 1/1025 |
| 2018/0213322 A1* | 7/2018 | Napoli | H04R 29/001 |
| 2019/0141446 A1* | 5/2019 | Moritoki | H04R 3/007 |
| 2019/0200122 A1* | 6/2019 | Lambert | H04R 9/025 |

* cited by examiner

*Primary Examiner* — Walter F Briney, III
(74) *Attorney, Agent, or Firm* — Slater Matsil, LLP

(57) ABSTRACT

A speaker system includes a speaker configured to output sound from an electric signal, a sensing unit configured to measure at least one of current or a voltage of the speaker, an amplifier configured to supply current to the speaker, and a control unit configured to measure inductance of the speaker on the basis of the at least one of the current or the voltage of the speaker, to determine a current temperature on the basis of the inductance, and to adjust current to be applied to the speaker by the amplifier on the basis of the current temperature such that a variation in output of the speaker with respect to a temperature is compensated for.

20 Claims, 7 Drawing Sheets

VEHICLE SPEAKER AND METHOD OF CONTROLLING THE SAME

CROSS-REFERENCE TO RELATED APPLICATIONS

This application claims priority to Korean Patent Application No. 10-2018-0160322, filed in the Korean Intellectual Property Office on Dec. 12, 2018, which application is hereby incorporated herein by reference.

TECHNICAL FIELD

The present invention relates to a vehicle including a speaker and a method of controlling the same.

BACKGROUND

In recent years, passengers in a vehicle are commonly enjoying not only radio, CD player, and MP3 but also television (TV), video, and other video/audio convenience apparatuses in a vehicle. Sound waves of the video/audio convenience apparatus are output to the interior of the vehicle through a speaker installed in a vehicle body, such as a door.

Such a speaker is an apparatus for outputting sound according to an electric signal amplified by an amplifier, and operates using a principle that a mechanical force acts on a voice coil in a magnetic field of a permanent magnet according to the intensity of power applied to the voice coil thus causes the voice coil to move.

SUMMARY

Therefore, it is an object of the present disclosure to provide a vehicle capable of outputting sound through a speaker and a method of controlling the same.

Additional aspects of the invention will be set forth in part in the description which follows and, in part, will be obvious from the description, or may be learned by practice of the invention.

Therefore, it is an aspect of the present invention to provide a vehicle including a speaker configured to output sound from an electric signal. A sensing unit is configured to measure at least one of current or a voltage of the speaker. An amplifier is configured to supply current to the speaker. A control unit is configured to measure inductance of the speaker on the basis of the at least one of the current or the voltage of the speaker, to determine a current temperature on the basis of the inductance, and to adjust current to be applied to the speaker by the amplifier on the basis of the current temperature such that a variation in output of the speaker with respect to a temperature is compensated for.

The control unit may determine compensation current that compensates for a change in magnetic flux of the speaker with respect to a temperature on the basis of the current temperature, and adjust the current to be supplied to the speaker by the amplifier on the basis of the determined compensation current.

The vehicle may further include a storage unit, wherein the control unit may determine a current temperature corresponding to the inductance on the basis of previously stored temperature information.

The control unit may measure a variation in inductance of the speaker on the basis of the at least one of the current or the voltage of the speaker, and determine the current temperature on the basis of the variation in inductance.

The control unit may measure a maximum value and a minimum value of the inductance of the speaker on the basis of the at least one of the current or the voltage of the speaker, and determine the variation in inductance on the basis of the maximum value and the minimum value.

The control unit may determine the compensation current such that an output of the speaker with respect to a predetermined reference temperature coincides with an output of the speaker with respect to the current temperature.

The control unit may control the amplifier to increase the current to be supplied to the speaker when the current temperature is higher than a predetermined reference temperature.

The control unit may control the amplifier to decrease the current to be supplied to the speaker when the current temperature is lower than a predetermined reference temperature.

The control unit may determine whether the current temperature lies within a predetermined normal range, and control the amplifier to stop supplying current to the speaker when the current temperature is determined to lie outside the predetermined normal range.

The vehicle may further include a display unit, wherein the control unit may control the display unit to notify a user with an alert when the current temperature lies outside the predetermined normal range It is another aspect of the present invention to provide a method of controlling a vehicle. The method includes measuring at least one of current or a voltage of a speaker, measuring inductance of the speaker on the basis of the at least one of the current or the voltage of the speaker, determining a current temperature on the basis of the inductance, adjusting current to be applied to the speaker on the basis of the current temperature such that a variation in output of the speaker with respect to a temperature is compensated for, and supplying the speaker with current that is adjusted.

The adjusting of current to be applied to the speaker on the basis of the current temperature may include determining compensation current that compensates for a change in magnetic flux of the speaker with respect to a temperature on the basis of the current temperature; and adjusting the current to be supplied to the speaker on the basis of the determined compensation current.

The determining of the current temperature may include determining a current temperature corresponding to the inductance on the basis of previously stored temperature information.

The measuring of the inductance of the speaker may include measuring a variation in inductance of the speaker on the basis of the at least one of the current or the voltage of the speaker. The determining of the current temperature includes determining of the current temperature on the basis of the variation in inductance.

The measuring of the inductance of the speaker may include measuring a maximum value and a minimum value of the inductance of the speaker on the basis of the at least one of the current or the voltage of the speaker, and determining the variation in inductance on the basis of the maximum value and the minimum value.

The determining of the compensation current on the basis of the current temperature may include determining the compensation current such that an output of the speaker with respect to a predetermined reference temperature coincides with an output of the speaker with respect to the current temperature.

The adjusting of the current to be supplied to the speaker may include increasing the current to be supplied to the speaker when the current temperature is higher than a predetermined reference temperature.

The adjusting of the current to be supplied to the speaker may include decreasing the current to be supplied to the speaker when the current temperature is lower than a predetermined reference temperature.

The method may further include determining whether the current temperature lies within a predetermined normal range, and stopping supplying current to the speaker when the current temperature is determined to lie outside the predetermined normal range.

The stopping of the current supplied to the speaker may include notifying a user with an alert when the current temperature lies outside the predetermined normal range.

BRIEF DESCRIPTION OF THE DRAWINGS

These and/or other aspects of the invention will become apparent and more readily appreciated from the following description of the embodiments, taken in conjunction with the accompanying drawings of which.

DETAILED DESCRIPTION OF ILLUSTRATIVE EMBODIMENTS

Figure 1:
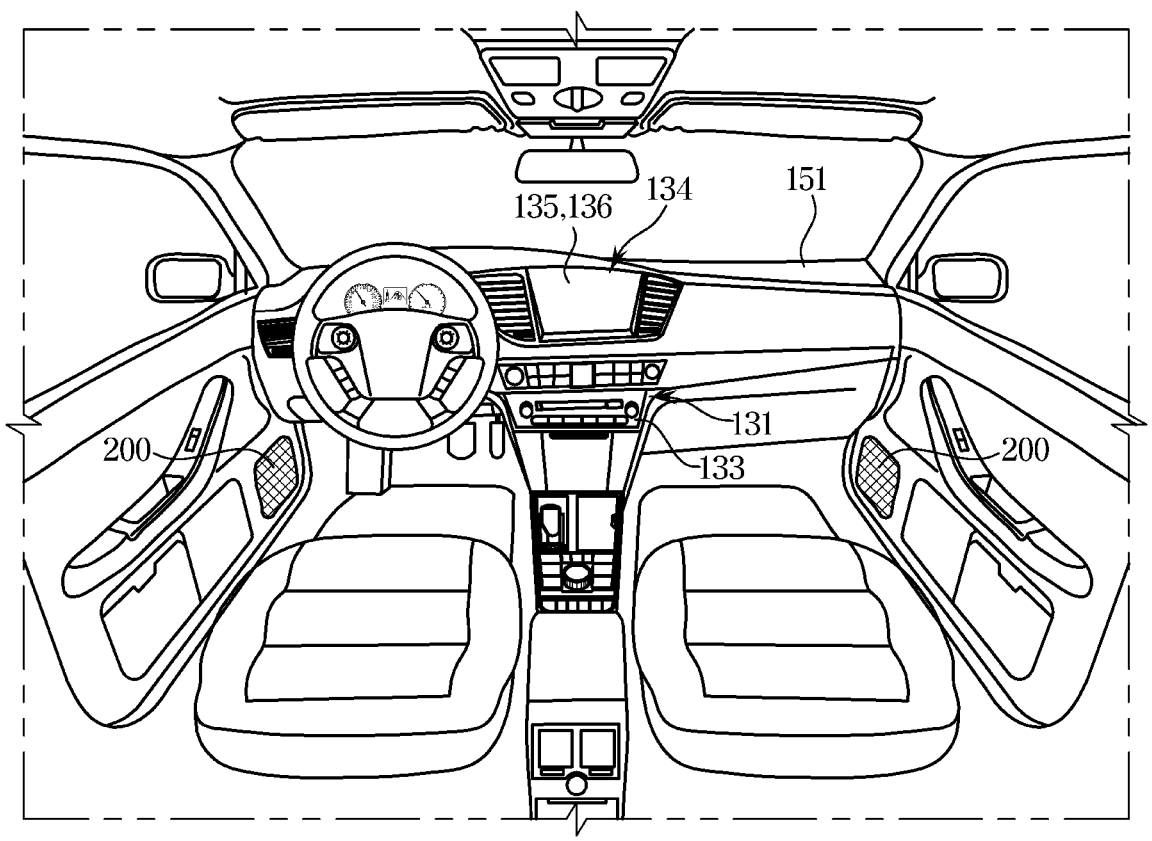
FIG. 1 is a view illustrating an internal configuration of a vehicle according to an embodiment.

Like numerals refer to like elements throughout the specification. Not all elements of embodiments of the present disclosure will be described, and description of what are commonly known in the art or what overlap each other in the embodiments will be omitted. The terms as used throughout the specification, such as "~part", "~module", "~member", "~block", etc., may be implemented in software and/or hardware, and a plurality of "~parts", "~modules", "~members", or "~blocks" may be implemented in a single element, or a single "~part", "~module", "~member", or "~block" may include a plurality of elements.

It will be further understood that the term "connect" or its derivatives refer both to direct and indirect connection, and the indirect connection includes a connection over a wireless communication network.

It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof, unless the context clearly indicates otherwise.

Although the terms "first," "second," "A," "B," etc. may be used to describe various components, the terms do not limit the corresponding components, but are used only for the purpose of distinguishing one component from another component.

As used herein, the singular forms "a," "an" and "the" are intended to include the plural forms as well, unless the context clearly indicates otherwise.

Reference numerals used for method steps are just used for convenience of explanation, but not to limit an order of the steps. Thus, unless the context clearly dictates otherwise, the written order may be practiced otherwise.

Hereinafter, the principles and embodiments of the disclosure will be described with reference to the accompanying drawings.

FIG. 1 is a view illustrating an internal configuration of a vehicle according to an embodiment.

Referring to FIG. 1, a vehicle 100 according to an embodiment may include a center fascia 131, a dashboard 151 on which a steering wheel is installed, a speaker 200 for providing sound to the inside of the vehicle 100.

The center fascia 131 may have an audio device 133 and an audio video navigation (AVN) device 134 mounted thereto.

The audio device 133 includes an operation panel having a plurality of buttons for performing functions of the audio device 133. The audio device may provide a radio mode for providing radio functions and a media mode for reproducing audio files of various storage media containing audio files.

The AVN device 134 may be embedded in the center fascia 131 of the vehicle 100. The AVN device 134 is a device that may perform a comprehensive function including an audio function, a video function, and a navigation function according to a user's manipulation. The AVN device 134 includes an input unit 135 for receiving a user command for the AVN device 134 and a display 136 for displaying a screen associated with the audio function, a screen associated with the video function, or a screen associated with the navigation function.

The speaker 200 may output sound from an electric signal. That is, the speaker 200 may provide sound to the interior of the vehicle 100.

The speaker 200 may be installed on an inner panel of the vehicle 100 including the door, and may be implementing using various types of speakers as long as it can be installed in the vehicle 100 without limitation of the installation position. For the sake of convenience in description, the following description will be made on the speaker 200 installed on a door as an example.

Figure 2:
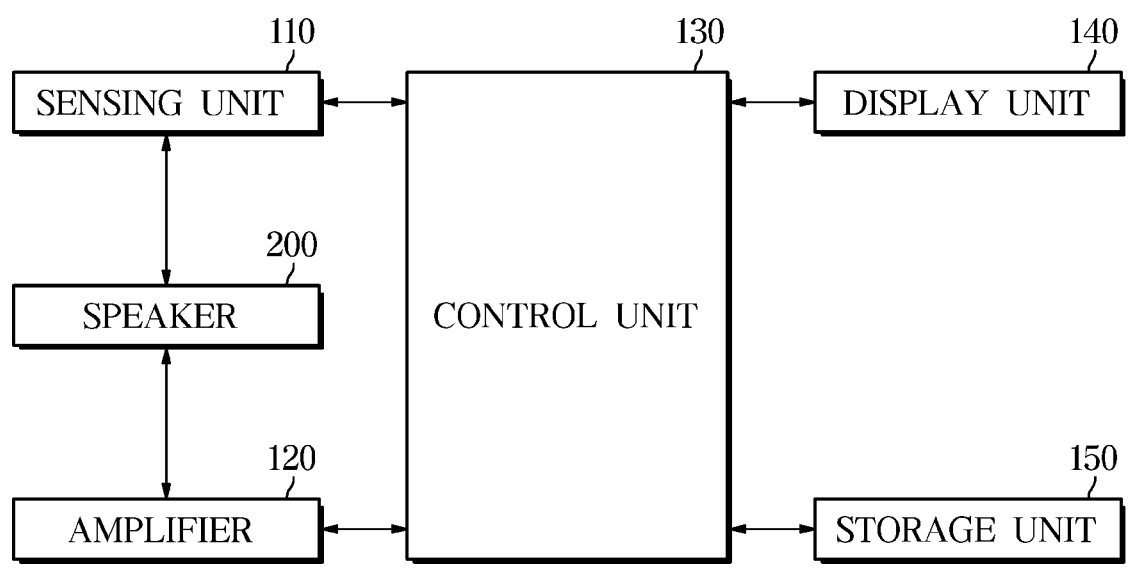
FIG. 2 is a control block diagram illustrating a vehicle according to an embodiment.

FIG. 2 is a control block diagram illustrating a vehicle according to an embodiment.

Referring to FIG. 2, the vehicle 100 according to the embodiment includes a sensing unit no, a speaker 200, an amplifier 120, a control unit 130, a display unit 140, and a storage unit 150.

The speaker 200 may receive an electric signal from the amplifier 120 and output sound from the electric signal. In detail, the speaker 200 may convert an electric signal into a mechanical signal, and provide a sound pressure according to the mechanical signal to thereby output sound. For example, the mechanical signal may include a vibration signal.

The sensing unit no may measure at least one of current or a voltage of the speaker 200. In detail, the sensing unit no may measure at least one of current or a voltage flowing in a voice coil (255 in FIG. 4) of the speaker 200.

Figure 4:
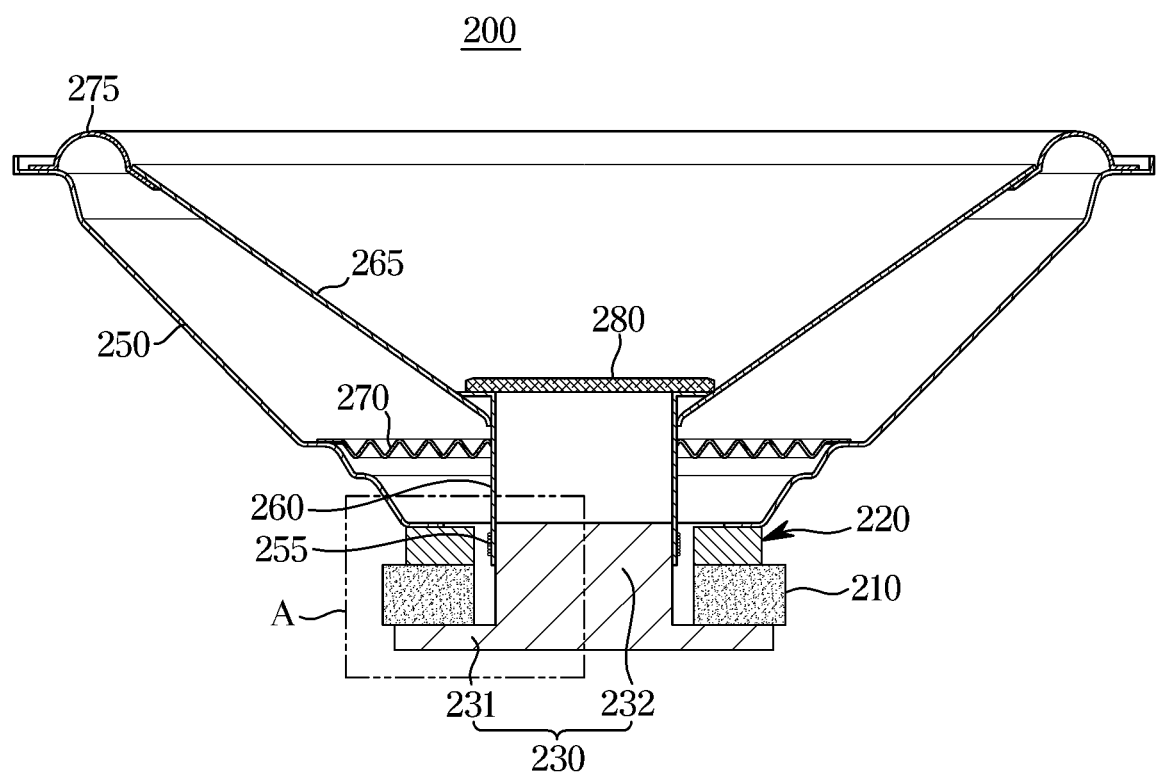
FIG. 4 is a cross-sectional view illustrating a speaker according to one embodiment.

In this case, the sensing unit no may measure at least one of current of a voltage of the voice coil (255 in FIG. 4) at an end of a connector (not shown) connected to the voice coil (255 in FIG. 4). For example, the sensing unit no may measure at least one of the current or voltage of the voice coil (255 in FIG. 4) at both ends of a connector (not shown) connected to the voice coil (255 in FIG. 4).

The amplifier 120 may transmit an electric signal to the speaker 200 and may supply the speaker 200 with current. The amplifier 120 may adjust the current to be supplied to the speaker 200 on the basis of a control signal of the control unit 130, which will be described below. In this case, the amplifier 120 may supply the speaker 200 with a voltage.

The display unit 140 may visually provide the user with various pieces of information.

To this end, the display unit 140 may include a cathode ray tube (CRT), a digital light processing (DLP) panel, a plasma display panel, a liquid crystal display (LCD) panel, an Electro Luminescence (EL) panel, an electrophoretic display (EPD) panel, an electrochromic display (ECD) panel, a light emitting diode (LED) panel, or an organic light emitting diode (OLED) panel, but the present invention is not limited thereto.

The control unit 130 may control the overall operation of various configurations of the vehicle 100. The control unit 130 may measure an inductance of the speaker 2000*n* the basis of at least one of the current or the voltage of the speaker 200. In this case, the inductance of the speaker 200 may be measured on the basis of at least one of the current or the voltage flowing in the voice coil (255 in FIG. 4).

In addition, the control unit 130 may determine the current temperature on the basis of the measured inductance and adjust the current to be supplied to the speaker 200 on the basis of the current temperature such that a change in output of the speaker 200 with respect to the temperature is compensated for.

In addition, the control unit 130 may determine compensation current for compensating for a change in magnetic flux of the speaker 200 with respect to the temperature on the basis of the current temperature, and may adjust the current to be supplied to the speaker 200 on the basis of the determined compensation current. Details thereof will be described below.

To this end, the control unit 130 may include a memory (not shown) for storing data regarding an algorithm for controlling the operations of the components of the vehicle 100 or a program that represents the algorithm, and a processor (not shown) that performs the above described operations using the data stored in the memory. In this case, the memory and the processor may be implemented as separate chips. Alternatively, the memory and the processor may be implemented as a single chip.

The storage unit 150 may include a nonvolatile memory device, such as a cache, a read only memory (ROM), a programmable ROM (PROM), an erasable programmable ROM (EPROM), an electrically erasable programmable ROM (EEPROM), and a flash memory, a volatile memory device, such as a random access memory (RAM), or other storage media, such as a hard disk drive (HDD), a CD-ROM, and the like, but the implementation of the storage unit 150 is not limited thereto. The storage unit 150 may be a memory implemented as a chip separated from the processor, which has been above in connection with the control unit 130, or may be implemented as a single chip integrated with the processor.

At least one component may be added or omitted to correspond to the performances of the components of the vehicle 100 shown in FIG. 2. In addition, the mutual positions of the components may be changed to correspond to the performance or structure of the system.

Meanwhile, each of the components shown in FIG. 2 may refer to a software component and/or a hardware component, such as a Field Programmable Gate Array (FPGA) and an Application Specific Integrated Circuit (ASIC).

Hereinafter, the structure of the speaker 200 for the vehicle will be described in more detail with reference to FIGS. 3 to 5.

Figure 3:
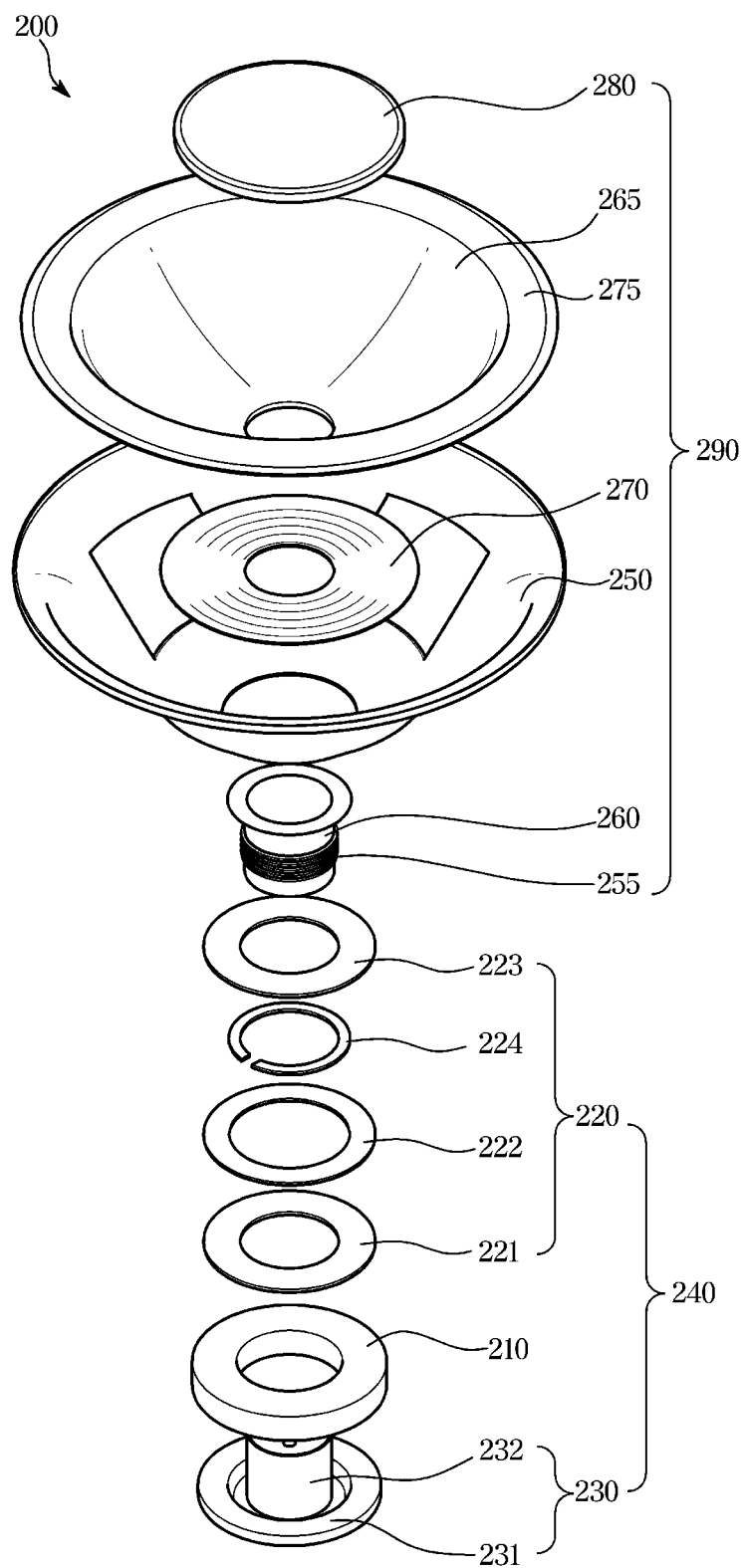
FIG. 3 is an exploded perspective view illustrating a speaker according to an embodiment.
Figure 5:
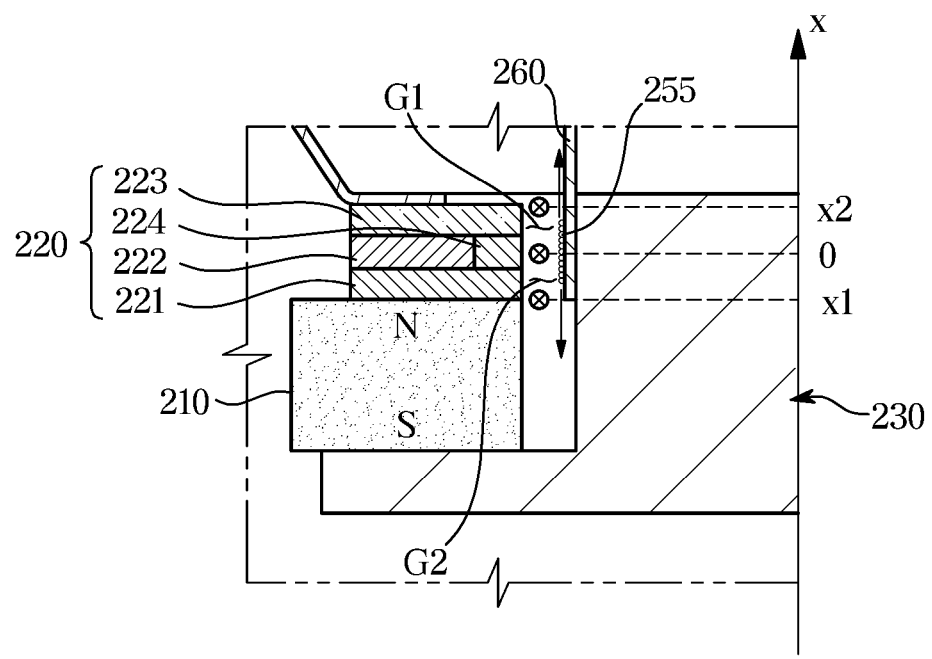
FIG. 5 is an enlarged view illustrating a portion A in FIG. 4.

FIG. 3 is an exploded perspective view illustrating a speaker according to an embodiment, FIG. 4 is a cross-sectional view illustrating a speaker according to one embodiment, and FIG. 5 is an enlarged view illustrating a portion A in FIG. 4.

Referring to FIGS. 3 to 5, the speaker 200 may have a magnetic circuit unit 240 and a vibration meter 290.

The magnetic circuit unit 240 may include a magnet 210 generating a magnetic flux, a top plate 220 forming a path of the magnetic flux generated in the magnet 210, and a yoke 230 supporting the magnet 210.

The magnet 210 may have an N pole and an S pole and may be magnetized in a direction from the front side to the rear side of the speaker 200. In the following description, the front side of the speaker 200 may refer to the upper side of FIG. 3, representing a direction in which sound waves travel, and the rear side of the speaker 200 may refer to the lower side in FIG. 3, representing the opposite direction. Details of the magnet 210 will be described later.

The top plate 220 may be disposed in a radial outer side of a pole piece 232 of the yoke 230. In more detail, the top plate 220 may be disposed on the top of the magnet 210 to form a path of the magnetic flux generated in the magnet 210. The top plate 220 includes a first magnetic plate 221, a spacer plate 222 stacked in front of the first magnetic plate 221, a second magnetic plate 223 stacked in front of the spacer plate 222, and a short ring 224 inserted into a space formed by the first magnetic plate 221, the spacer plate 222, and the second magnetic plate 223.

The first magnetic plate 221, the spacer plate 222, and the second magnetic plate 223 may be formed of magnetic material having a low magnetoresistance, for example, steel, alloy or other magnetic material. The first magnetic plate 221, the spacer plate 222, and the second magnetic plate 223 may be separately provided and coupled to each other. The first magnetic plate 221, the spacer plate 222, and the second magnetic plate 223 may be coupled to each other through an adhesive member or through a fastening member, such as a screw. Since the first magnetic plate 221, the spacer plate 222, and the second magnetic plate 223 are separately provided and coupled to each other, the assembly of the short ring 224 may be easily achieved.

The first magnetic plate 221 may be stacked in front of the magnet 210. The first magnetic plate 221 may be provided in a substantially ring shape having a hollow, and the pole piece 232 of the yoke 230 may be inserted into the hollow. The first magnetic plate 221 may be provided flat in a constant thickness.

The second magnetic plate 223 may be provided in a substantially ring shape having a hollow, and the pole piece 232 of the yoke 230 may be inserted into the hollow. The second magnetic plate 223 may be provided flat in a constant thickness.

The first magnetic plate 221 and the second magnetic plate 223 may have the same shape. The first magnetic plate 221 and the second magnetic plate 223 may have the same thickness. Since the first magnetic plate 221 and the second magnetic plate 223 are provided to have the same thickness, the voice coil 255 linearly moves.

The spacer plate 222 may be provided between the first magnetic plate 221 and the second magnetic plate 223 such that the first magnetic plate 221 and the second magnetic plate 223 are spaced apart from each other. The spacer plate 222 may be provided in a substantially ring shape having a hollow, and the pole piece 232 of the yoke 230 may be inserted into the hollow. The spacer plate 222 may be provided flat in a constant thickness.

The first magnetic plate 221 and the second magnetic plate 223 may be formed closer to the pole piece 232 than the spacer plate 222, and thus an empty space may be formed between a front surface of the first magnetic plate 221, a rear surface of the second magnetic plate 223, and an inner surface of the spacer plate 222. The short ring 224 may be inserted into the empty space.

The short ring 224 is formed of material having a magnetic permeability lower than those of the first magnetic plate 221 and the second magnetic plate 223 such that the magnetic flux concentrates on the first magnetic plate 221 and the second magnetic plate 223. In addition, the short ring 224 may firmly support the first magnetic plate 221 and the second magnetic plate 223 while in close contact with the first magnetic plate 221 and the second magnetic plate 223. The short ring 224 may have a closed ring shape or a broken ring shape.

The yoke 230 may include a back plate 231 provided at a rear side thereof to support the magnet 210 and the pole piece 232 protruding forward from the center of the back plate 231. With this configuration, the yoke 230 has a first magnetic gap G1 formed between the first magnetic plate 221 and the pole piece 232 and a second magnetic gap G2 formed between the second magnetic plate 223 and the pole piece 232.

With this configuration, a part of the magnetic force lines starting from the N pole of the magnet 210 may pass through the first magnetic plate 221, the first magnetic gap G1, the pole piece 232, and the back plate 231 to the S pole of the magnet 210. The remaining magnetic force lines may pass through the second magnetic plate 223, the second magnetic gap G2, the pole piece 232, the back plate 231, and the magnet 210 to the S pole of the magnet 210.

Since the first magnetic gap G1 and the second magnetic gap G2 are arranged at a predetermined distance in the front and rear side direction, the moving distance of the voice coil 255 may be increased and the leakage magnetic flux may be reduced.

The vibration meter 290 includes a frame 250, a voice coil 255 disposed in the first magnetic gap G1 and the second magnetic gap G2 and move in the front and rear side direction while interacting with a magnetic flux in the first magnetic gap G1 and the second magnetic gap G2, a bobbin 260 around which the voice coil 255 is wound, a cone paper 265 for generating a sound pressure by vibrating according to the movement of the voice coil 255, a damper 270 for guiding the movement of the voice coil 255 in the front and rear side direction while restraining the movement in the left and right side direction, an edge 275 for coupling an outer edge of the cone paper 265 to the frame 250, and a dust cap 280 for preventing foreign substance from being introduced into the first magnetic gap G1 and the second magnetic gap G2.

The frame 250 may form the external appearance of the speaker 200. According to one example, the frame 250 may include at least one material selected from the group consisting of polypropylene and twisted glass fiber (TGF) such that vibration of the vibration meter 290 may be smoothly performed.

The voice coil 255 may be appropriated designed to have a height suitable for interacting with the magnetic flux in the first magnetic gap G1 and the second magnetic gap G2. For example, the height of the voice coil 255 may be equal to the sum of the thickness of the first magnetic plate 221 and the thickness of the spacer plate 222. Alternatively, the height of the voice coil 255 may be equal to the sum of the thickness of the second magnetic plate 223 and the thickness of the spacer plate 222. Alternatively, the height of the voice coil 255 may be equal to the sum of a half the thickness of the first magnetic plate 221, a half the thickness of the second magnetic plate 223, and the thickness of the spacer plate 222. Alternatively, the height of the voice coil 255 may be equal to the sum of the thickness of the first magnetic plate 221, the thickness of the spacer plate 222, and the thickness of the second magnetic plate 223. Alternatively, the height of the voice coil 255 may be smaller or larger than the sum of the thickness of the first magnetic plate 221, the thickness of the spacer plate 222, and the thickness of the second magnetic plate 223.

When no current is applied to the voice coil 255, the voice coil 255 may be positioned in the middle of the entire section of the top plate 220. For example, the voice coil 255 may have a displacement of 0 when no current is applied to the voice coil 255.

Meanwhile, referring to FIG. 5, a portion of the magnetic force lines formed at the N pole may pass through the first magnetic plate 221, the pole piece 232, and the back plate 231 to the S pole of the magnet 210. The remaining may pass through the second magnetic plate 223, the pole piece 232, and the back plate 231 to the S pole of the magnet 210.

The magnetic force lines may have a magnetic path perpendicular to the voice coil 255. In this state, when power is applied to the voice coil 255, an electromagnetic force is applied to the voice coil 255 by the magnetic field formed in the magnetic circuit unit 240, and the voice coil 255 is vibrated by the electromagnetic force. The electromagnetic force applied to the voice coil 255 is expressed by Equation 1.

$$F = BIL \qquad \text{[Equation 1]}$$

In Equation 1, F denotes an electromagnetic force, B denotes a magnetic field, I denotes current, and L denotes the length of the coil.

The voice coil 255, while vibrating, causes the cone paper 265 to vibrate, and the cone paper 265 generates a sound pressure while vibrating according to the movement of the voice coil 255. In this case, the voice coil 255 may perform a linear movement between a first displacement x1 and a second displacement x2 with respect to the displacement 0. That is, the voice coil 255 may vibrate.

In general, components such as an engine may be exposed to a high temperature environment, so that the speaker 200 in the vehicle 100 may be exposed to a high temperature environment. Such a change in temperature causes a change in magnetic flux density of the magnet 210, and the change in magnetic flux density results in a change in output of the speaker. Such a change in the speaker output may cause distortion of the sound quality.

The change in magnetic flux density with the temperature may cause a change in electromagnetic force, and since the intensity of a force acting on the voice coil 255 is changed by the change in electromagnetic force, the displacement of the voice coil 255 may be changed.

The displacement of the voice coil 255 is related to an inductance component of the voice coil 255. Details thereof will be described with reference to FIG. 6.

Figure 6:
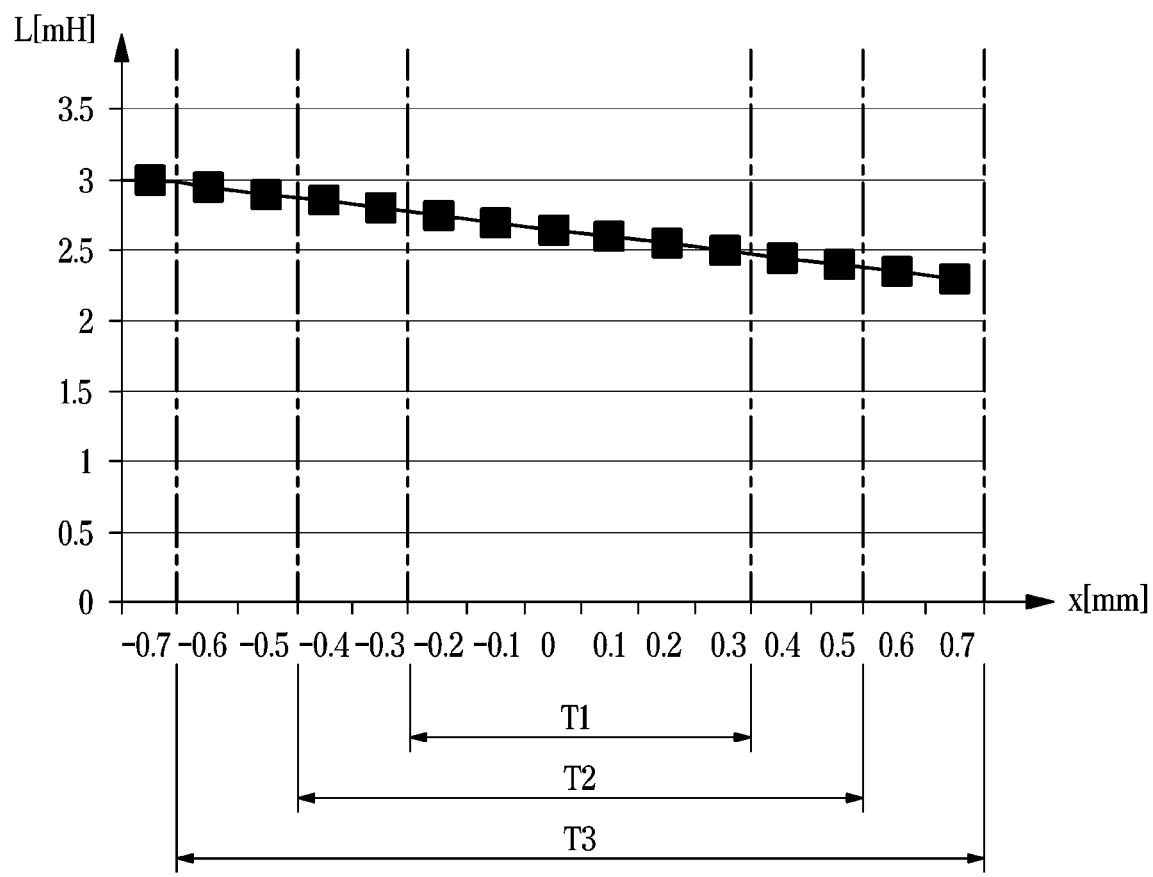
FIG. 6 is a view for describing a change in inductance of a speaker according to an embodiment.

FIG. 6 is a view for describing a change in inductance of a speaker according to an embodiment.

Referring to FIG. 6, the inductance L of the speaker 200 refers to an inductance L component of the voice coil 255, and the inductance L component of the voice coil 255 has a value that is changed by the displacement.

In this case, the variation in the inductance L component of the voice coil 255 may have different ranges at different temperatures T1, T2, and T3.

For example, at a first temperature T1, the inductance L component of the voice coil 255 may have a range of $2.5 \leq L < 2.8$ [mH]. That is, the variation in inductance (L) component may be 0.3 [mH]. At a second temperature T2, the inductance L component of the voice coil 255 may have a range of $2.4 \leq L < 2.9$ [mH], and the variation in inductance L component may be 0.5 [mH]. At a third temperature $T_3$, the inductance L component of the voice coil 255 may have a range of $2.3 \leq L < 3$ [mH], and the variation in inductance L component may be 0.7 [mH].

Such a diversification of the ranges of the variation in the inductance with the temperature is due to the change in magnetic flux density with the temperature that changes the intensity of the force acting on the voice coil 255. The variation in inductance with the temperature also exerts an influence on the movement of the voice coil 255, finally exerting an influence on the output of the speaker 200.

Accordingly, in order to compensate for the change in output of the speaker 200 with respect to the temperature, the current to be supplied to the speaker 200 may be adjusted.

The control unit 130 may measure the inductance of the voice coil 255 on the basis of at least one of the current or voltage of the voice coil 255 measured by the sensing unit no, and may determine the current temperature on the basis of the inductance.

To this end, the sensing unit no may measure at least one of the current or voltage of the voice coil (255 in FIG. 4) at an end of the connector (not shown) connected to the voice coil 255. For example, the sensing unit no may measure at least one of the current or voltage of the voice coil 255 at both ends of the connector (not shown) connected to the voice coil 255.

In detail, the control unit 130 may measure the variation in inductance of the voice coil 255 on the basis of at least one of the current or voltage of the voice coil 255, and may determine the current temperature on the basis of the variation in inductance.

In this case, the control unit 130 may measure at least one of a maximum value or a minimum value of the inductance of the voice coil 255 on the basis of at least one of the current or voltage of the voice coil 255, and may measure the variation in inductance on the basis of the at least one of the minimum value or the minimum value of the inductance.

For example, the control unit 130 may measure the difference between the maximum value and the minimum value of the inductance of the voice coil 255 as a variation in inductance.

The control unit 130 may determine the current temperature corresponding to the inductance on the basis of previously stored temperature information. In this case, the temperature information refers to information including an inductance of the speaker 200 corresponding to a specific temperature, and may include inductances by temperatures or variations in inductance by temperatures.

In addition, the temperature information may further include information including a displacement of the voice coil 255 corresponding to a specific temperature, and may include positions of the voice coil 255 by temperatures or variations in position of the voice coil 255 by temperatures. Such temperature information may be stored in the storage unit 150.

In detail, the control unit 130 may determine a temperature corresponding to an acquired inductance from the previously stored temperature information to be the current temperature.

In a case when a variation in inductance is measured, the control unit 130 may determine a temperature corresponding to the variation in inductance on the basis of the temperature information to be the current temperature.

For example, with respect to stored temperature information indicating that the variation in inductance is 0.7 [mH] at −20° C., the variation in inductance is 0.5 [mH] at 20° C., and the variation in inductance is 0.3 [mH] at 60° C., when a measured variation in inductance is 0.5 [mH], the control unit 130 may determine the current temperature to be 20° C.

The control unit 130 may compare the determined current temperature with a predetermined reference temperature and adjust the current to be supplied to the speaker 200 by the amplifier 120 according to the comparison result.

When the determined current temperature is different from the predetermined reference temperature, the control unit 130 may determine compensation current for compensating for a change in magnetic flux of the speaker 200 with respect to the temperature on the basis of the current temperature, and adjust the current to be supplied to the speaker 200 by the amplifier 120 on the basis of the compensation current.

In detail, the control unit 130 may determine the compensation current such that the output of the speaker 200 with respect to the predetermined reference temperature coincides with the output of the speaker 200 with respect to the current temperature.

The control unit 130 may determine compensation current for generating an electromagnetic force having the same intensity as that of the electromagnetic force acting on the voice coil 255 with respect to the predetermined reference temperature, on the basis of the current temperature.

The control unit 130 may compare the intensity of the electromagnetic force (a first electromagnetic force) acting on the voice coil 255 at the current temperature with the intensity of the electromagnetic force (a second electromagnetic force) acting on the voice coil 255 at the predetermined reference temperature, and may determine compensation current that may compensate for the difference between the intensity of the first electromagnetic force and the intensity of the second electromagnetic force.

The control unit 130 may determine compensation current for generating an electromagnetic force having an intensity corresponding to a difference between the first electromagnetic force and the second electromagnetic force, and adjust the current to be supplied to the speaker 200 by adding or subtracting the compensation current to or from the current supplied to the speaker 200.

In detail, when the first electromagnetic force is smaller than the second electromagnetic force, the control unit 130 may add compensation current for generating an electromagnetic force having an intensity corresponding to the difference between the first electromagnetic force and the second electromagnetic force to the current supplied to the speaker 200. According to the compensation current from the amplifier 120, the second electromagnetic force may act on the voice coil 255, thus even at the current temperature different from the reference temperature, the same electromagnetic force as that at the reference temperature acts on the voice coil 255, so that the output of the speaker 200 coincides with the output at the reference temperature. Accordingly, the speaker 200 may output sound without loss, and sound quality loss may be prevented.

Alternatively, when the first electromagnetic force is larger than the second electromagnetic force, the control unit 130 may subtract compensation current for generating an electromagnetic force having an intensity corresponding to the difference between the first electromagnetic force and the second electromagnetic force from the current supplied to the speaker 200. According to the compensation current from the amplifier 120, the second electromagnetic force may act on the voice coil 255, thus even at the current temperature different from the reference temperature, the same electromagnetic force as that at the reference temperature acts on the voice coil 255, so that the output of the speaker 200 coincides with the output at the reference temperature. Accordingly, the speaker 200 may output sound without loss, and sound quality loss may be prevented.

In other words, the control unit 130 may control the amplifier 120 to increase the current to be supplied to the speaker 200 when the current temperature is higher than the predetermined reference temperature. Alternatively, the control unit 130 may control the amplifier 120 to reduce the current to be supplied to the speaker 200 when the current temperature is lower than the predetermined reference temperature.

For example, the control unit 130 may set the reference temperature to 20° C., and set the electromagnetic force acting on the voice coil 255 with respect to the reference temperature 20° C. to 4.2N.

In this case, when the current temperature corresponding to a measured impedance is −20° C. and the electromagnetic force acting on the voice coil 255 with respect to −20° C. is 4.6N, the control unit 130 may determine current that compensates for an electromagnetic force of 0.4 N to be the compensation current. The control unit 130 may subtract the compensation current for compensating for an electromagnetic force of 0.4N from the current supplied to the speaker 200. Accordingly, the control unit 130 may allow an electromagnetic force having the same intensity as that of the electromagnetic force at the reference temperature of 20° C. to be generated.

As another example, when the current temperature corresponding to a measured impedance is 60° C. and the electromagnetic force acting on the voice coil 255 with respect to 60° C. is 3.8 N, the control unit 130 may determine current that compensates for an electromagnetic force of 0.4 N to be the compensation current. The control unit 130 may add the compensation current for compensating for an electromagnetic force of 0.4N to the current supplied to the speaker 200. Accordingly, the control unit 130 may allow an electromagnetic force having the same intensity as that of the electromagnetic force at the reference temperature of 20° C. to be generated.

In addition, the control unit 130 may check whether the measured current temperature lies within a predetermined normal range. When the current temperature does not lie within the predetermined normal range, the control unit 130 may control the amplifier 120 to stop supplying the current to the speaker 200.

In addition, when the current temperature does not lie within the predetermined normal range, the control unit 130 may control the display unit 140 to notify the user of an alert. Accordingly, the control unit 130 may prevent the speaker 200 from being damaged from a sudden change in temperature, and notify the user of the damage, thereby enhancing the safety and user convenience.

Figure 7:
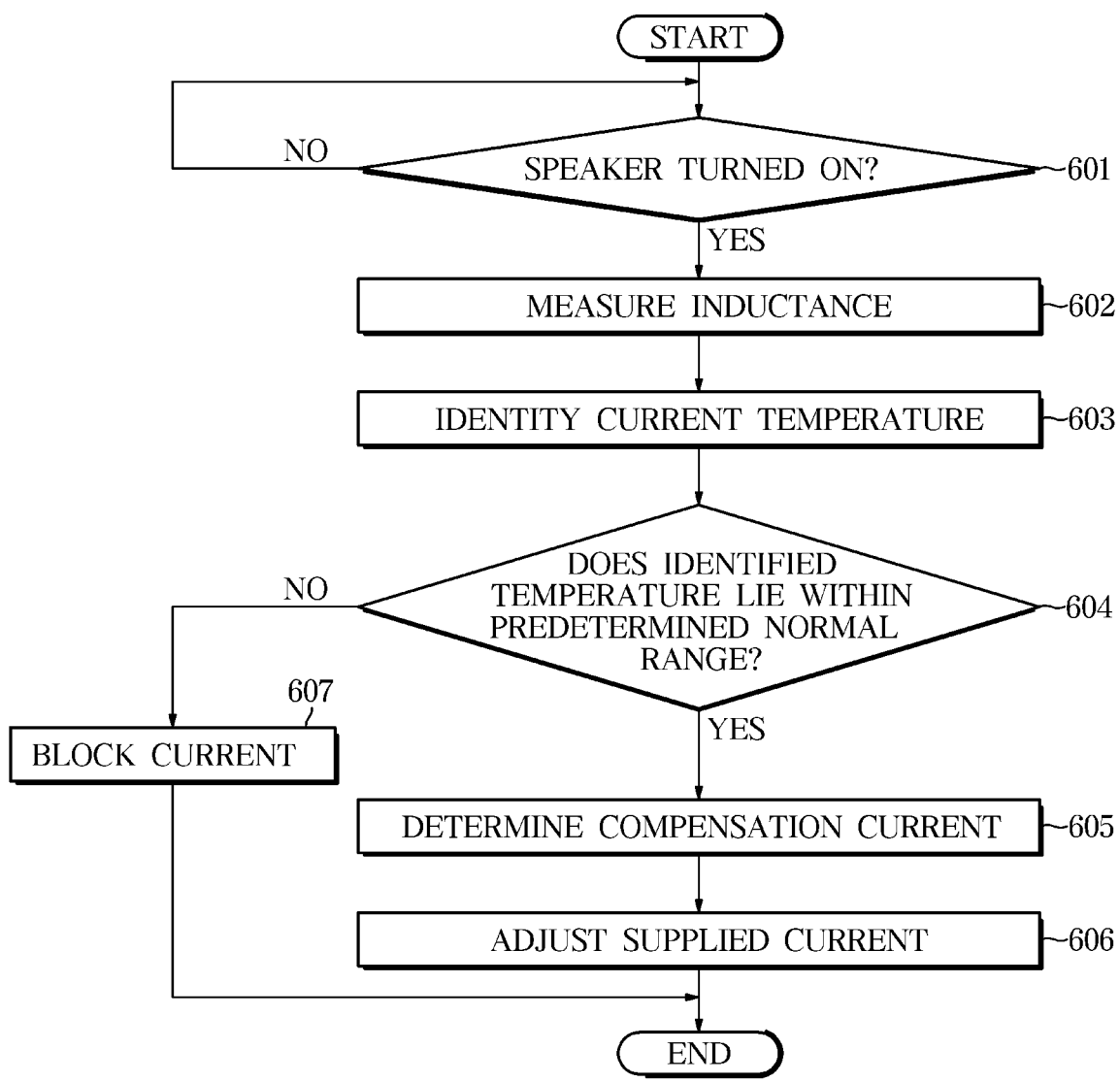
FIG. 7 is a flowchart showing a method of controlling a vehicle according to an embodiment.

FIG. 7 is a flowchart showing a method of controlling a vehicle according to an embodiment.

Referring to FIG. 7, the vehicle 100 according to the embodiment may check whether the speaker 200 is turned on (601). In detail, when the voltage or current is applied to the speaker 200 by the amplifier 120, the vehicle 100 may determine that the speaker 200 is turned on.

When the speaker 200 is turned on (YES in operation 601), the vehicle 100 may measure the inductance of the speaker 200 (602). In detail, the vehicle 100 may measure the inductance on the basis of at least one of the current or the voltage of the speaker 200, the inductance of the speaker 200 may refer to the inductance of the voice coil 255, and the current or voltage of the voice coil 255 may refer to the current or voltage flowing in the voice coil 255.

The vehicle 100 may measure at least one of a maximum value or a minimum value of the inductance on the basis of the least one of the current or voltage of the voice coil 255, and may measure a variation in inductance on the basis of the at least one of the maximum value or minimum value of the inductance.

In this case, the vehicle 100 may measure the inductance in real time or at a predetermined period, and may measure the at least one of the current or the voltage of the speaker 200 in real time or at a predetermined period.

When the inductance is measured, the vehicle 100 may identify the current temperature on the basis of the inductance (603).

In detail, the vehicle 100 may measure the variation in inductance of the voice coil 255 on the basis of at least one of the current or voltage of the voice coil 255, and may identify the current temperature on the basis of the variation in inductance.

The vehicle 100 may determine the current temperature corresponding to the variation in inductance on the basis of previously stored temperature information. In detail, the vehicle 100 may identify a temperature corresponding to an acquired inductance from the previously stored temperature information as the current temperature.

In a case when the variation in inductance is measured, the vehicle 100 may determine a temperature corresponding to the variation in inductance on the basis of the temperature information, and may identify the temperature to be the current temperature.

When the current temperature is identified, the vehicle 100 may determine whether the identified temperature lies within a predetermined normal range (604).

When the identified temperature lies within the predetermined normal range (YES in operation 604), the vehicle 100 may determine compensation current on the basis of the identified temperature (605). In detail, the vehicle 100 may compare the determined current temperature with a predetermined reference temperature, and adjust the compensation current for the amplifier 120 according to the comparison result.

In this case, the compensation current refers to current for compensating for a change in magnetic flux of the speaker 200 with respect to the temperature and for matching the output of the speaker 200 with respect to the current temperature and the output of the speaker 200 with respect to the predetermined reference temperature.

The vehicle 100 may compare the intensity of the electromagnetic force (a first electromagnetic force) acting on the voice coil 255 at the current temperature with the intensity of the electromagnetic force (a second electromagnetic force) acting on the voice coil 255 at the predetermined reference temperature, and may determine compensation current that may compensate for the difference between the intensity of the first electromagnetic force and the intensity of the second electromagnetic force.

The vehicle 100 may determine compensation current for generating an electromagnetic force having an intensity corresponding to a difference between the first electromagnetic force and the second electromagnetic force, and adjust the current to be supplied to the speaker 200 by adding or subtracting the compensation current to or from the current supplied to the speaker 200 (606).

In detail, when the first electromagnetic force is smaller than the second electromagnetic force, the vehicle 100 may add compensation current for generating an electromagnetic force having an intensity corresponding to the difference between the first electromagnetic force and the second electromagnetic force to the current supplied to the speaker 200. According to the compensation current from the amplifier 120, the second electromagnetic force may act on the voice coil 255, thus even at the current temperature different from the reference temperature, the same electromagnetic force as that at the reference temperature acts on the voice coil 255, so that the output of the speaker 200 coincides with the output at the reference temperature. Accordingly, the speaker 200 may output sound without loss, and sound quality loss may be prevented.

Alternatively, when the first electromagnetic force is larger than the second electromagnetic force, the vehicle 100 may subtract compensation current for generating an electromagnetic force having an intensity corresponding to the difference between the first electromagnetic force and the second electromagnetic force from the current supplied to the speaker 200. According to the compensation current from the amplifier 120, the second electromagnetic force may act on the voice coil 255, thus even at the current temperature different from the reference temperature, the same electromagnetic force as that at the reference temperature acts on the voice coil 255, so that the output of the speaker 200 coincides with the output at the reference temperature. Accordingly, the speaker 200 may output sound without loss, and sound quality loss may be prevented.

In other words, the control unit 130 may control the amplifier 120 to increase the current to be supplied to the speaker 200 when the current temperature is higher than the predetermined reference temperature. Alternatively, the control unit 130 may control the amplifier 120 to reduce the current to be supplied to the speaker 200 when the current temperature is lower than the predetermined reference temperature.

As another example, when the identified temperature does not lie within the predetermined normal range (NO in operation 604), the vehicle 100 blocks the current supplied to the speaker 200 (S607). In detail, the vehicle 100 may control the amplifier 120 to stop supplying the current to the speaker 200.

In this case, the vehicle 100 may notify the user of an alert, so that the vehicle 100 may prevent the speaker 200 from being damaged from a sudden change in temperature. The vehicle 100 may compensate for the output of the speaker 200 with respect to the temperature, so that the sound quality loss is prevented. Accordingly, the safety and user convenience may be enhanced.

As is apparent from the above, the vehicle and the method of controlling the same can prevent sound quality from being distorted and implement stable sound quality by compensating for a change in output of the speaker according to a temperature change.

Although exemplary embodiments of the present disclosure have been described for illustrative purposes, those skilled in the art will appreciate that various modifications, additions and substitutions are possible, without departing from the scope and spirit of the disclosure. Therefore, exemplary embodiments of the present disclosure have not been described for limiting purposes.

What is claimed is:

1. A vehicle comprising:
   a speaker configured to output sound from an electric signal;
   a sensing unit configured to measure a current or a voltage of the speaker;
   an amplifier configured to supply current to the speaker; and
   a control unit configured to measure a maximum value and a minimum value of an inductance of the speaker based on the current or the voltage of the speaker, to determine a current temperature based on a difference between the maximum value and the minimum value of the inductance, and to adjust current to be applied to the speaker by the amplifier based on the current temperature to compensate for a variation in output of the speaker with respect to a temperature.

2. The vehicle of claim 1, wherein the control unit is configured to determine a compensation current that compensates for a change in magnetic flux of the speaker with respect to a temperature based on the current temperature and to adjust the current to be supplied to the speaker by the amplifier based on the determined compensation current.

3. The vehicle of claim 2, wherein the control unit is configured to determine the compensation current such that an output of the speaker with respect to a predetermined reference temperature coincides with an output of the speaker with respect to the current temperature.

4. The vehicle of claim 1, further comprising a storage unit, wherein the control unit is configured to determine the current temperature corresponding to the difference between the maximum value and the minimum value of the inductance based on previously stored temperature information.

5. The vehicle of claim 1, wherein the control unit is configured to control the amplifier to increase the current to be supplied to the speaker when the current temperature is higher than a predetermined reference temperature.

6. The vehicle of claim 1, wherein the control unit is configured to control the amplifier to decrease the current to be supplied to the speaker when the current temperature is lower than a predetermined reference temperature.

7. The vehicle of claim 1, wherein the control unit is configured to determine whether the current temperature lies within a predetermined normal range, and to control the amplifier to stop supplying current to the speaker when the current temperature is determined to lie outside the predetermined normal range.

8. The vehicle of claim 7, further comprising a display unit, wherein the control unit is configured to control the display unit to notify a user with an alert when the current temperature lies outside the predetermined normal range.

9. The vehicle of claim 1, wherein the control unit is configured to determine that the smaller the difference between the maximum value and the minimum value of the inductance, the higher the current temperature.

10. A method of controlling a speaker system, the method comprising:
measuring a current or a voltage of a speaker;
measuring a maximum value and a minimum value of an inductance of the speaker based on the current or the voltage of the speaker;
determining a current temperature based on a difference between the maximum value and the minimum value of the inductance;
adjusting a current to be applied to the speaker based on the current temperature to compensate for a variation in output of the speaker with respect to a temperature; and
supplying the speaker with the adjusted current.

11. The method of claim 10, wherein adjusting the current comprises:
determining a compensation current that compensates for a change in magnetic flux of the speaker with respect to a temperature based on the current temperature; and
adjusting the current to be supplied to the speaker based on the determined compensation current.

12. The method of claim 11, wherein determining the compensation current comprises determining the compensation current such that an output of the speaker with respect to a predetermined reference temperature coincides with an output of the speaker with respect to the current temperature.

13. The method of claim 10, wherein determining the current temperature comprises determining the current temperature corresponding to the difference between the maximum value and the minimum value of the inductance from previously stored temperature information.

14. The method of claim 10, wherein the adjusting of the current to be supplied to the speaker includes increasing the current to be supplied to the speaker when the current temperature is higher than a predetermined reference temperature.

15. The method of claim 10, wherein adjusting the current to be supplied to the speaker comprises decreasing the current to be supplied to the speaker when the current temperature is lower than a predetermined reference temperature.

16. The method of claim 10, further comprising:
determining whether the current temperature lies within a predetermined normal range; and
stopping current from being supplied to the speaker when the current temperature is determined to lie outside the predetermined normal range.

17. The method of claim 16, wherein the stopping comprises notifying a user with an alert that the current temperature lies outside the predetermined normal range.

18. The method of claim 10, wherein determining the current temperature comprises determining that the smaller the difference between the maximum value and the minimum value of the inductance, the higher the current temperature.

19. A speaker system comprising:
a speaker configured to output sound from an electric signal;
a sensing unit configured to measure a current or a voltage of the speaker;
an amplifier configured to supply current to the speaker;
a storage unit; and
a control unit configured to:
measure a maximum value and a minimum value of an inductance of the speaker based on the current or the voltage of the speaker;
determine a current temperature based on a difference between the maximum value and the minimum value of the inductance;
adjust current to be applied to the speaker by the amplifier based on the current temperature to compensate for a variation in output of the speaker with respect to a temperature;
control the amplifier to increase the current to be supplied to the speaker when the current temperature is higher than a predetermined reference temperature; and
control the amplifier to decrease the current to be supplied to the speaker when the current temperature is lower than the predetermined reference temperature.

20. The speaker system of claim 19, wherein the control unit is configured to determine a compensation current that compensates for a change in magnetic flux of the speaker with respect to a temperature based on the current temperature and to adjust the current to be supplied to the speaker by the amplifier based on the determined compensation current.

* * * * *